(12) United States Patent
Dangelewicz et al.

(10) Patent No.: US 6,314,660 B1
(45) Date of Patent: Nov. 13, 2001

(54) CASCADED TENSIONING TANGENTIAL DRIVE FOR THA HANDLING

(75) Inventors: John Dangelewicz; Steven W. Steinfield, both of San Diego, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/186,784

(22) Filed: Nov. 4, 1998

(51) Int. Cl.$^7$ ........................................ F26B 13/00
(52) U.S. Cl. .................. 34/616; 34/236; 34/617; 34/620
(58) Field of Search ............... 34/208, 236, 616, 34/617, 620

(56) References Cited

U.S. PATENT DOCUMENTS

| | | | |
|---|---|---|---|
| 2,302,730 | * 11/1942 | Woodford | 34/617 |
| 2,800,726 | * 7/1957 | Koch et al. | 34/208 |
| 3,418,724 | * 12/1968 | Futer | 34/236 |
| 3,745,670 | * 7/1973 | Hartwig | 34/236 |
| 4,194,300 | * 3/1980 | Swanson et al. | 34/236 |
| 4,949,474 | * 8/1990 | Berg | 34/236 |
| 4,991,315 | * 2/1991 | Fakck | 34/236 |
| 5,537,757 | * 7/1996 | Gray | 34/208 |
| 5,568,171 | 10/1996 | Keefe et al. | |

FOREIGN PATENT DOCUMENTS

| | | | |
|---|---|---|---|
| 497769 | * 5/1930 | (DE) | 34/617 |
| 793216 | * 4/1958 | (GB) | 34/150 |
| 606530 | * 7/1960 | (IT) | 34/620 |

* cited by examiner

Primary Examiner—John Kwon

(57) ABSTRACT

A system and method for fabricating flexible circuits. The inventive system includes an oven and three or more independent tensioners for moving a strip of flex tape therethrough. In total, N tensioners are provided per side. The tensioners provide a cumulative tension force T on the tape and each tensioner applies T/N of the total tension. The tension is applied tangentially in a single plane of the tape along a direction parallel to the longitudinal axis thereof In the illustrative embodiment, the tensioners are sprocket wheels. Eight sprocket wheels are disposed on a supply side of the system and eight wheels are disposed on a take-up side of the system. The sprocket wheels are adapted to engage sprocket holes in the tape. The tape has a sprocket wheel area and a die area. A silicon die is typically bonded to the die area with a suitable epoxy. Copper conductors on the tape communicate electrical signals from a printer or other mechanism to the silicon die. The inventive system maintains high tension on the tape as it moves through a plurality of bake ovens. High tension is distributed over a longer area of the tape than with prior systems and is maintained without exposing the flex circuit to a stressful bend angle. In addition, each sprocket hole experiences minimal force due to the force/tension distribution methodology of the inventive system.

29 Claims, 8 Drawing Sheets

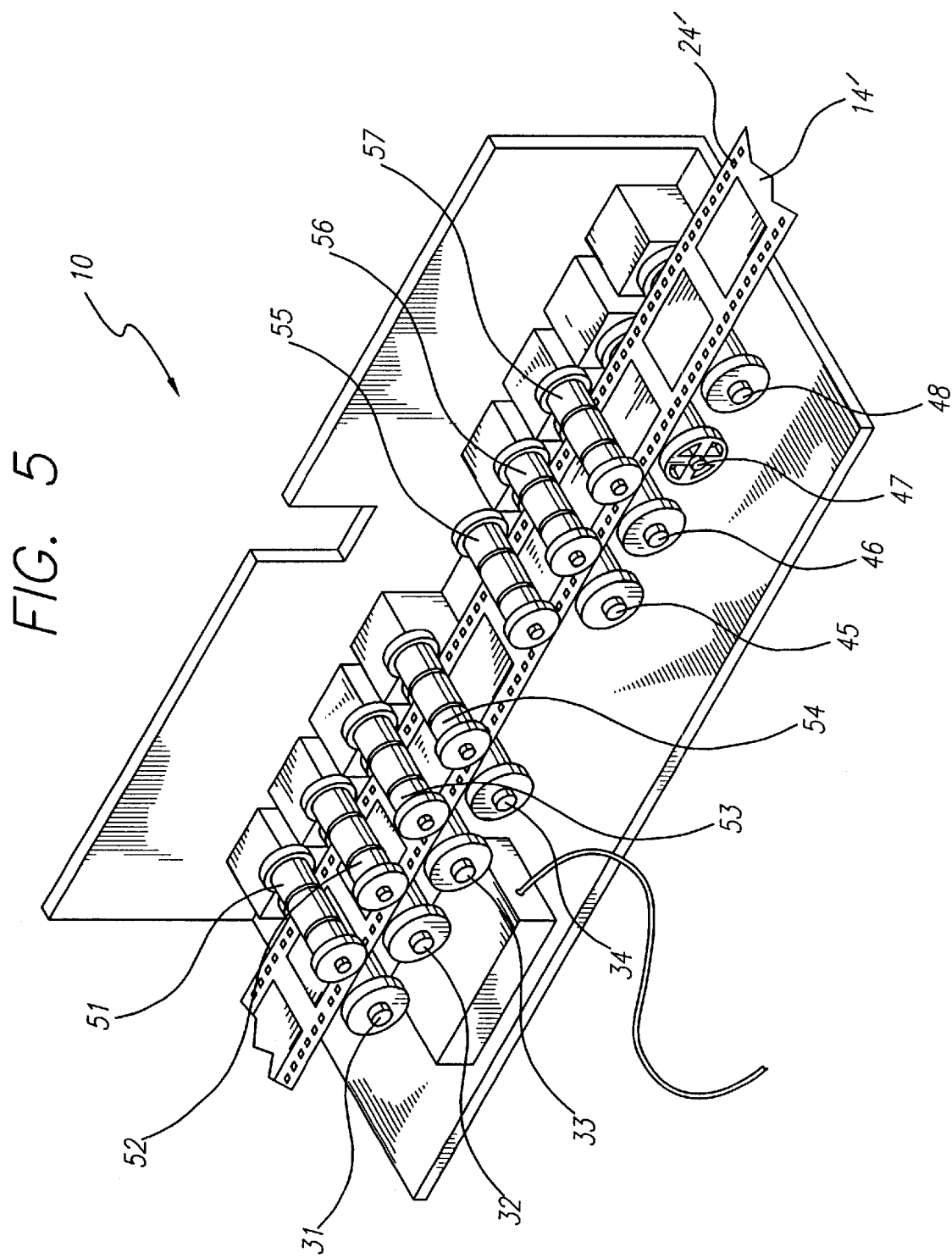

US 6,314,660 B1

CASCADED TENSIONING TANGENTIAL DRIVE FOR THA HANDLING

BACKGROUND OF THE INVENTION

1. Field of the Invention

The present invention relates to systems and methods for manufacturing tab head assembly (THA) flex circuits. More specifically, the present invention relates to drive systems for linear bake ovens used in the fabrication of flex circuits.

2. Description of the Related Art

Flexible circuits, often referred to as 'flex circuits', are used in a number of applications. In an illustrative application, a flex circuit is used to convey electrical signals from a printer to an inkjet pen. The flex circuit used for this application is often fabricated on tab head assembly (THA) tape. THA tape is a strip of polyester or polyimid material such as a Mylar or Kapton which provides a substrate into which multiple copper conductors are embedded. The tape is typically on the order of 2 inches wide and 2 mils (0.002 inches) thick. A plurality of sprocket holes are provided along the edge of the tape on either side of a central die area onto which a silicon die is bonded with a suitable epoxy.

Electrical signals are communicated from the printer to the die through the copper circuitry in the Kapton material and into the silicon die. As described more fully in U.S. Pat. No. 5,568,171 issued Oct. 22, 1996 to Keefe et al., the specification and drawings of which are incorporated herein by reference, the electrical signals selectively activate a number of resistors in integrated circuit print heads fabricated in the die. The flow of current through the resistors heats and vaporizes ink and cause it to be expelled through a small nozzle toward print media, e.g., paper.

Fabrication of the THA involves pulling the tape off a reel with a linear drive system such as that manufactured and sold by Owens Design in Fremont, Calif. The drive system pulls the tape through a bake oven which cures the epoxy interface between the Kapton and the die. The conventional oven is actually eight ovens arranged in series to provide varying temperature environments for the tape as it moves therethrough: a gradually increasing thermal environment in a first few ovens, a stable temperature environment through the middle ovens, and a decreasing temperature environment through the last two or three ovens.

Current manufacturing techniques require a high tension (e.g. on the order of 1200 grams) on the tape throughout the curing process. The conventional linear drive system maintains high tension with supply and take-up sprocket wheels having a plurality of sprockets designed to engage sprocket holes on the THA tape. The high tension is maintained with a 90° bend of the tape around the sprocket wheels.

Unfortunately, for current more demanding applications, the desired length of the rigid silicon die has grown to one inch. Accordingly THA tape carrying such dies can not be wrapped around a sprocket wheel under such high tension without an unacceptable amount of stress, deformation, and damage to the tape. Such damage to the THA tape has been found to include excessive wrinkling, delamination, broken TAB contacts, or sprocket hole damage.

Hence, there is a need in the art for a safe and effective system and method for fabricating THA tape for inkjet pens without exposing the tape and any long die thereon to undesirable stress, deformation, and damage.

SUMMARY OF THE INVENTION

The need in the art is addressed by the system and method for fabrication of flexible circuits of the present invention. The inventive system includes an oven and three or more independent tensioners for moving a strip of THA flex tape therethrough. In total, N tensioners are provided. The tensioners provide a cumulative tension force T on the tape and each tensioner applies T/N of the total tension. The tension is applied tangentially in a single plane of the tape along a direction parallel to the longitudinal axis thereof In the illustrative embodiment, the tensioners are sprocket wheels. Eight sprocket wheels are disposed on a supply side of the system and eight are disposed on a take-up side of the system. The sprocket wheels are adapted to engage sprocket holes in the tape. The cumulative tension is applied over a segment of the tape of a length.

The tape is THA tape typically made of polyimid or other suitable material. The tape has a sprocket hole area and a die area. A silicon die is typically bonded to the die area with a suitable epoxy. Copper conductors embedded in the tape communicate electrical signals from a printer or other mechanism to the silicon die.

The inventive system maintains high tension on the tape as it moves through a plurality of bake ovens. High tension is distributed over a longer area of the tape than with prior systems and is maintained without exposing the flex circuit to a stressful bend angle. In addition, each sprocket hole experiences minimal force due to the force/tension distribution methodology of the present invention.

BRIEF DESCRIPTION OF THE DRAWINGS

FIG. 5 is a perspective view of a simplified embodiment of the system of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
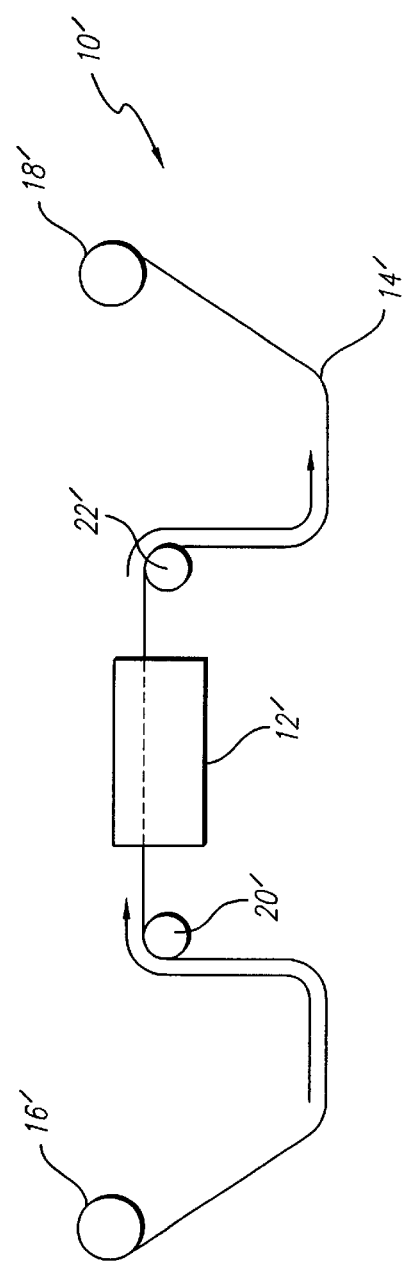
FIG. 1 is a simplified diagram of a linear bake oven system constructed in accordance with conventional teachings.

FIG. 1 is a simplified diagram of a linear bake oven system constructed in accordance with conventional teachings such as that manufactured and sold by Owens Design in Fremont, Calif. The system 10' includes an oven 12' through which tape 14' is moved from a supply reel 16' to a take-up reel 18' by a supply sprocket wheel 20' and a take-up sprocket wheel 22'. The ovens are manufactured and sold by Blue-M. The tape may be made of any flexible material. As mentioned above, in the illustrative application, the tape 14' is made of polyester or polymid material such as Mylar or Kapton. As is known in the art, the tape 14' provides a substrate into which multiple copper conductors are embedded. The tape 14' is typically on the order of 2 inches wide and 2 mils (0.002 inches) thick.

Figure 2:
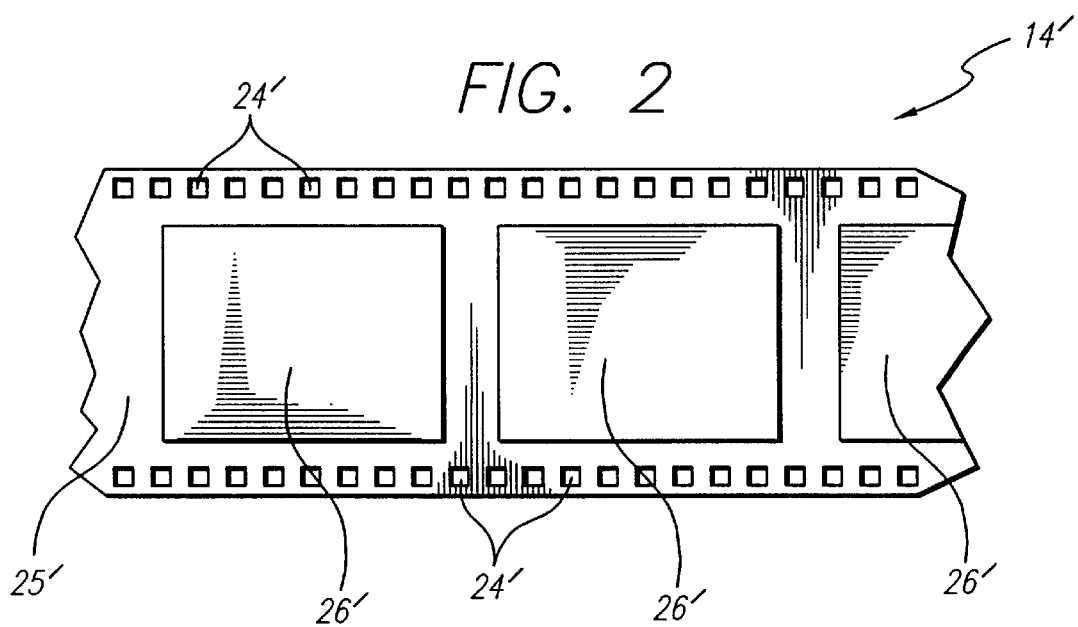
FIG. 2 is a top view of a section of THA flex tape.

As illustrated in the top view of FIG. 2, a plurality of sprocket holes 24' are provided along the edge of the tape on either side of a central die area 25' onto which a silicon die 26' is bonded with a suitable epoxy. In practice, the control die area is actually three silicon die in the preferred embodiment. Electrical signals are typically communicated from the printer (not shown) to the die 26' through the copper circuitry (not shown) and into the silicon die. As described more fully in U.S. Pat. No. 5,568,171 issued Oct. 22, 1996 to Keefe et al., the specification and drawings of which are incorporated herein by reference, the electrical signals selectively activate a number of resistors fabricated in the die. The die is in the printhead. The flow of current through the resistors heat and vaporize liquid ink and cause it to be expelled through a small nozzle in the print head toward print media, e.g., paper.

Fabrication of the THA flex tape involves pulling the tape off the supply reel 16' through the bake oven 12' which cures the epoxy interface between the Kapton and die. Conventionally, the oven 12' is actually eight ovens arranged in series to provide a gradually increasing thermal environment for the tape, as it moves therethrough: a gradually increasing thermal environment in a first few ovens, a stable temperature environment through the middle ovens, and a decreasing temperature environment through the last two or three ovens.

Figure 3:
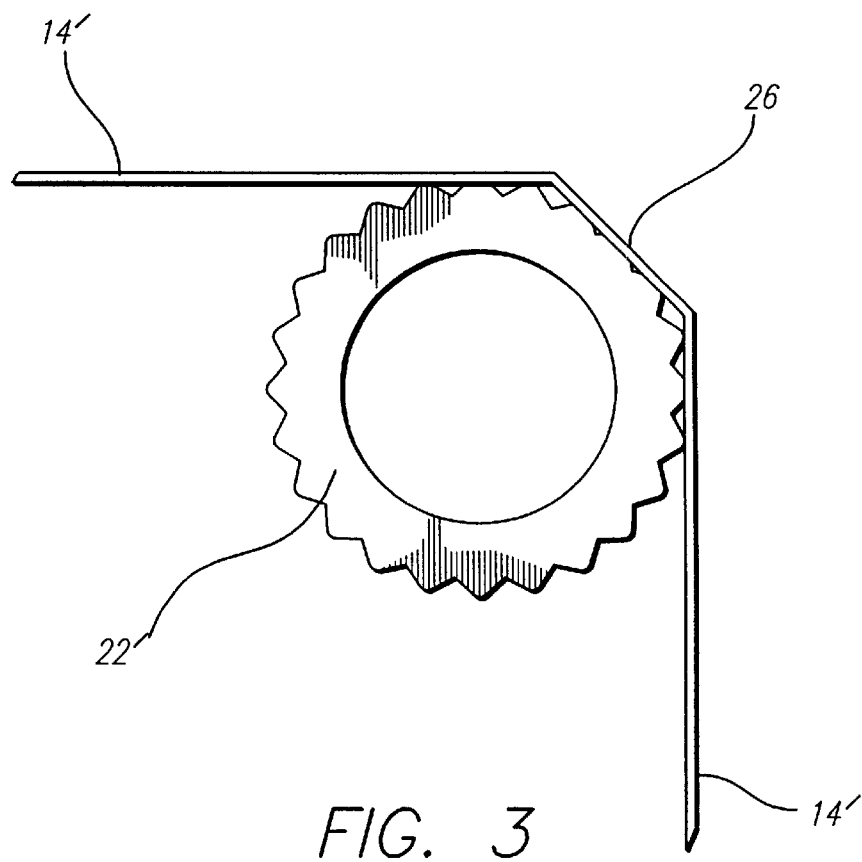
FIG. 3 is a magnified view of a take-up drive wheel of the linear bake oven system of FIG. 1.

Current THA flex tape manufacturing techniques require a high tension (e.g. on the order of 1200 grams) on the tape throughout curing process. The conventional linear drive system 10' maintains high tension with the supply and take-up sprocket wheels 20' and 22'. However, as depicted in the magnified partial side view of the take-up sprocket illustrated in FIG. 3, the high tension is maintained with a 90° bend of the tape 14' around the sprocket wheels. Unfortunately, as mentioned above, for current applications, the rigid silicon die 26' typically has a length of one inch and therefore can not be wrapped around a typically 10" sprocket wheel under such high tension without an unacceptable amount of stress, deformation, and damage. The stress often causes excessive wrinkling, delamination, broken TAB contacts, and/or sprocket hole damage.

Hence, there has been a need in the art for a safe and effective system and method for fabricating THA tape without exposing the tape and the die thereon to undesirable stress, deformation, and damage. The need is addressed by the system and method for fabrication of flexible circuits of the present invention. The system and method of the present invention is illustrated in the diagram of FIG. 4.

Figure 4:
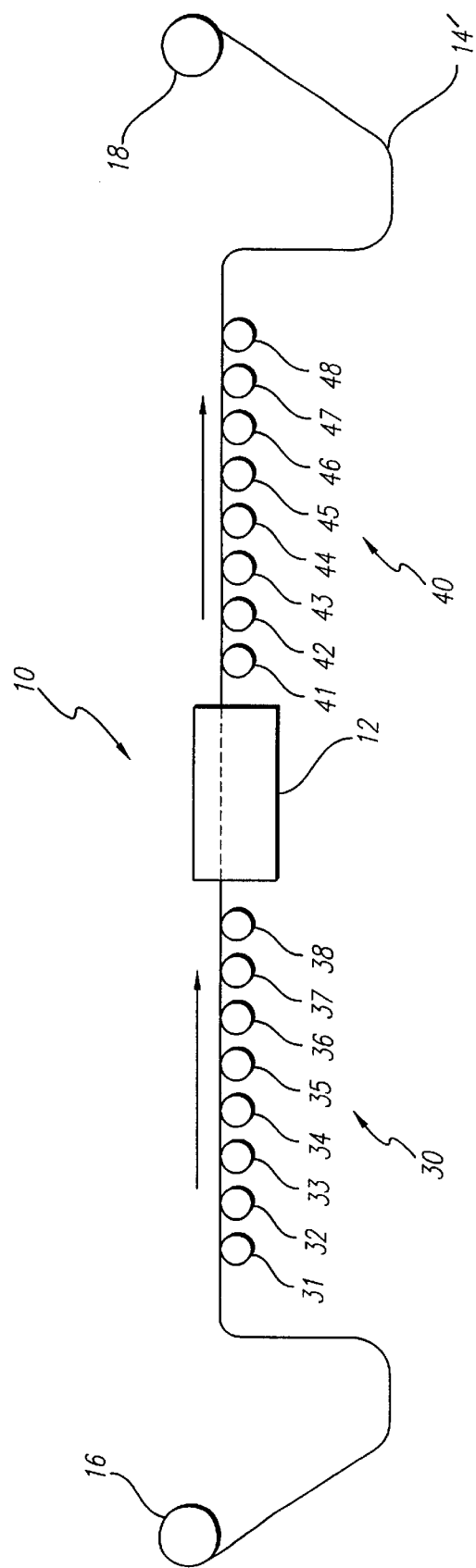
FIG. 4 shows a simplified diagram of a linear bake oven system constructed in accordance with the present teachings.

FIG. 4 shows a simplified diagram of a linear bake oven system constructed in accordance with the present teachings.

The inventive system 10 includes the linear bake oven 12, as per conventional teachings, through which tape 14' is moved from a supply reel 16 to a take-up reel 18 by a plurality of independent tensioners 30 and 40. In total, N tensioners are provided. In the illustrative embodiment, the tensioners are sprocket wheels. In FIG. 4, N=16 with eight sprocket wheels 31–38 on the supply side 30 and eight sprocket wheels 41–48 on the take-up side 40.

The sprocket wheels are adapted to tangentially engage the sprocket holes in the tape 14'. The tensioners provide a cumulative tension force T on the tape and each "tension pair" on each side of the system 10 applies T/N of the total tension. The tension from the supply side sprockets balances the tension from the take-up side sprockets. So there are 8 pairs of sprockets, and each pair contributes T/N where N=8. The tension is applied tangentially in a single plane of the tape along a direction parallel to the longitudinal axis thereof. In the illustrative embodiment, the diameter of each wheel is approximately three inches.

In FIG. 4, sprocket wheels 31–38 are passive tensioning sprockets. As discussed more fully below, these sprockets are coupled to hysteresis slip clutches that are set to maintain the maximum "safe" torque. In the illustrative embodiment, the safe torque is 150 grams of tension at the tangent point with the flex tape.

Sprocket wheels 41–47 are active tensioning sprockets and are coupled to the hysteresis slip clutches in the same manner as per the passive tensioning sprockets. However, the clutches used in connection with the active tensioning sprockets are coupled to motors that rotate clockwise or a plurality of drive components coupled to a single motor at a constant nominal speed e.g., 8.13 cm/min., preferably 10–70% faster than the maximum indexing speed of an indexing sprocket 48. When the flex tape 14' is loaded, it will constrain the active tensioning sprockets to follow the indexing sprocket 48, while the overslipping clutches smoothly transmit their preset torque load from the motors to the sprocket wheels.

The indexing sprocket 48 is coupled to a stepper or servo motor which provides precise positional indexing and/or velocity control of the drive train. It is coupled to the indexing motor through a safety clutch which acts as rigid coupling (necessary for precise indexing and/or velocity control) unless the torque exceeds some safety limit which should not occur during normal operation. Note that the indexing sprocket also pulls a load equal to the difference between the total passive tension and the total active tension.

When the flex tape is not loaded in the system 10, all sprocket wheels can rotate independently of one another.

During normal operation, when the flex tape is loaded and the index wheel 48 is controlled to rotate clockwise either continuously or stepwise, the steady state tension will occur as shown in FIG. 4. Note that, in the preferred embodiment, the net force applied by any one sprocket never exceeds 200 g for the illustrative flex tape having dimensions of 2 inches in width and 2 mils thickness. Those skilled in the art will appreciate that any number of sprocket wheels could be used with the multiple sprockets combining to transmit to the tape multiples of the unit force applied by a single sprocket without exceeding the unit force on any one sprocket wheel.

In practice, this may be confirmed by placing the passive tensioning sprocket wheels on a linear slide. The linear slide is adapted to act against a digital force gauge. Thus, the maximum tension between the passive and active elements is sensed by the force gauge. This reading can be used to verify the tension or to give an indication of tension variability that might be caused by misalignment, a bad bearing, or some other malfunction.

FIG. 5 is a perspective view of a simplified embodiment of the system 10 of the present invention. The embodiment of FIG. 5 has only four passive tensioning supply sprockets 31–34 and four active tensioning take-up sprockets 45–48. Note the use of pinch rollers 51–57 to facilitate the engagement of the sprockets in the wheels with the sprocket holes 24' of the tape 14'. As the tape 14' moves through the system 10, the tape 14' is maintained in rectilinear alignment with the longitudinal axis thereof and parallel to the velocity vector thereof viz., the tape is kept flat. As a result, the tape is not wrapped around any of the sprocket wheels under load.

FIGS. 6–9 depict front and side views of a portion of an alternative embodiment of the system 10" of the present invention. The embodiment of FIGS. 6–9 is functionally identical to that of FIG. 4 with the exception that two tracks are provided instead of one as discussed below.

Figure 6:
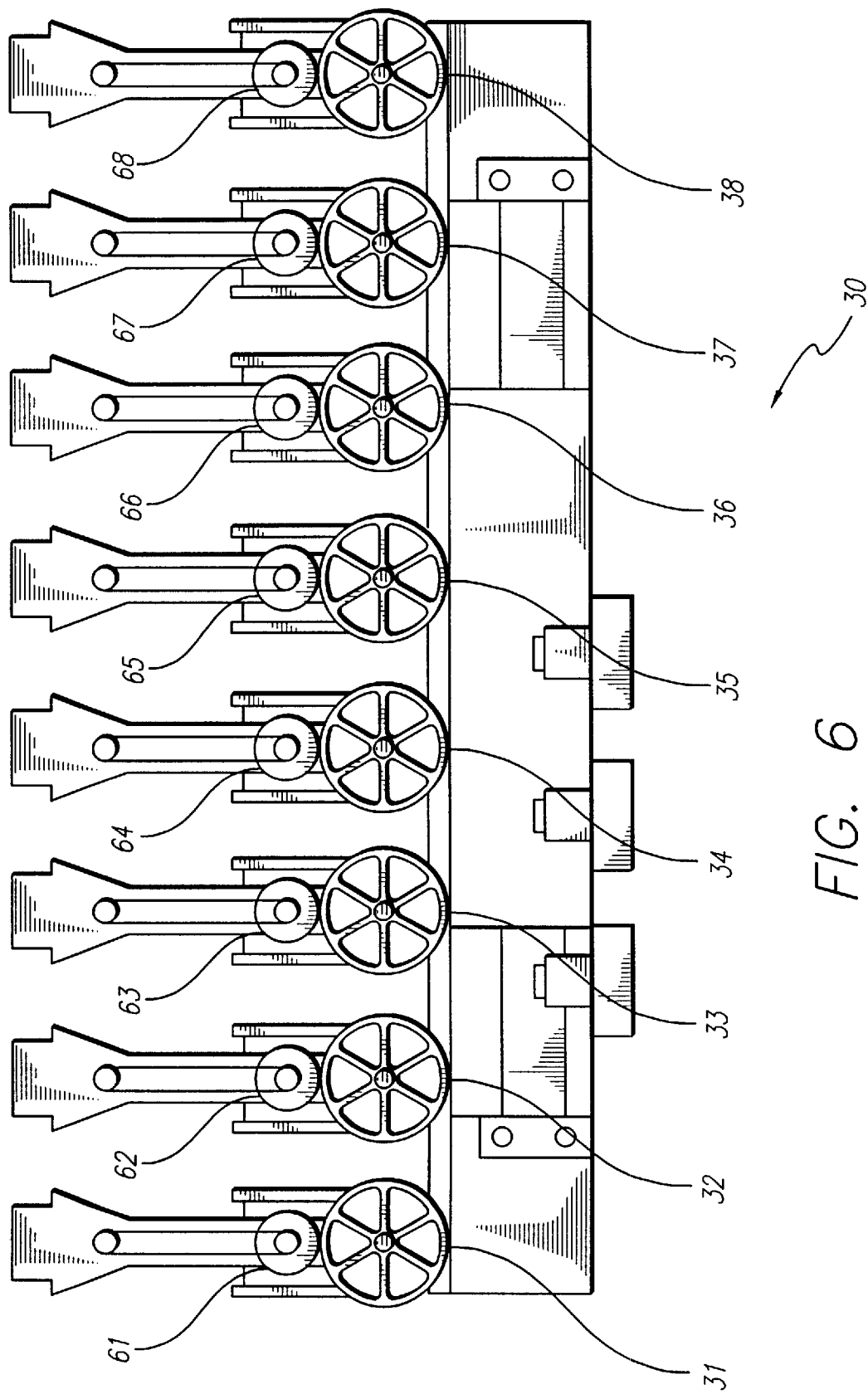
FIG. 6 is a partial side view of the system of the alternative embodiment of the invention showing the supply side drive system thereof.

FIG. 6 is a partial side view of the system of the alternative embodiment of the invention showing the supply side drive system 30". Those skilled in the art will recognize that any number of tracks can be used.

Figure 7:
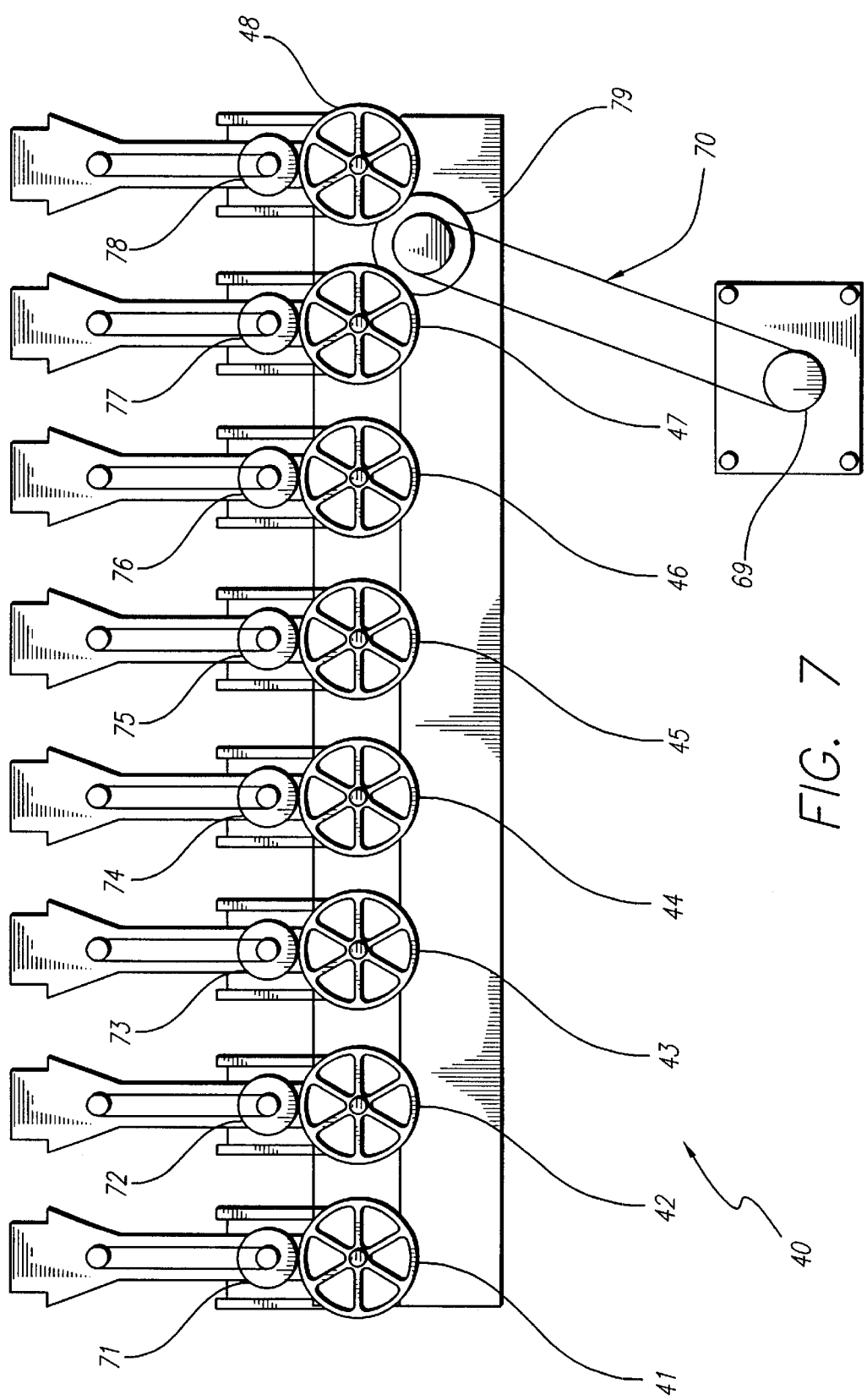
FIG. 7 is a partial side view of the system of the alternative embodiment of the invention showing the take-up side drive system thereof.

FIG. 7 is a partial side view of the system of the alternative embodiment of the invention showing the take-up side drive system 40".

Figure 8:
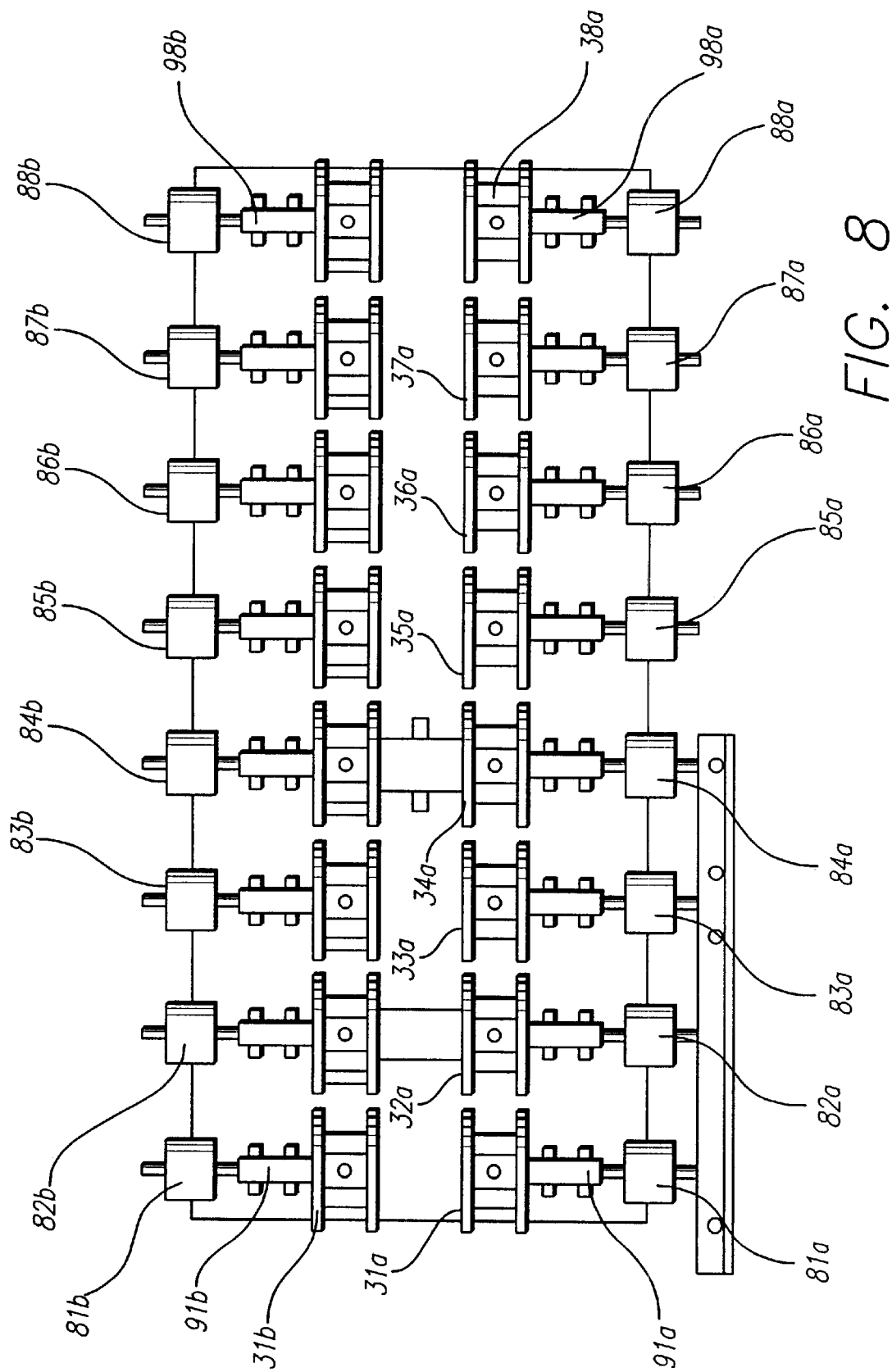
FIG. 8 is a top view of the system of the alternative embodiment of the invention showing the supply side drive system thereof.

FIG. 8 is a top view of the system of the alternative embodiment of the invention showing the supply side drive system 30".

Figure 9:
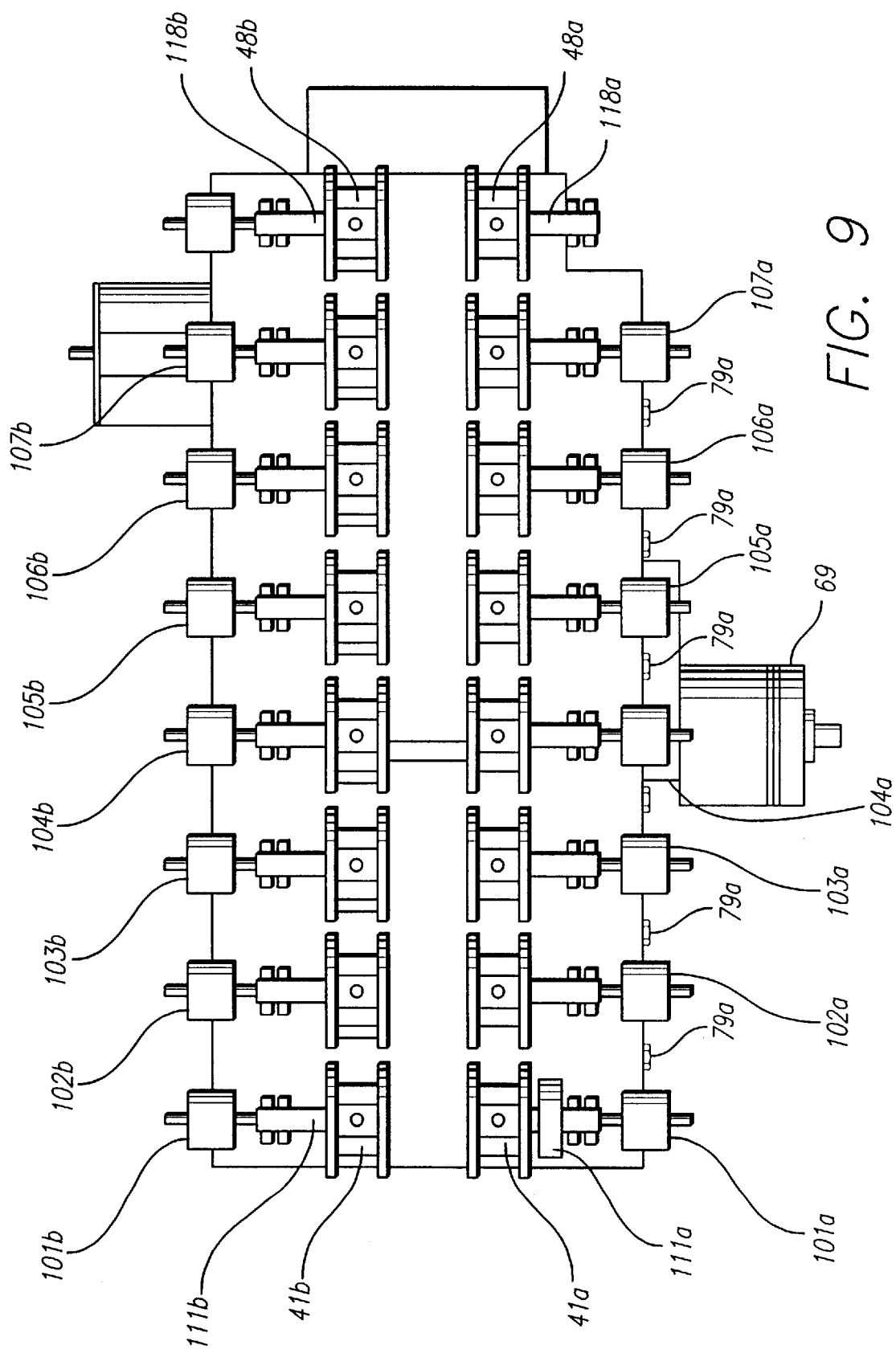
FIG. 9 is a top view of the system of the alternative embodiment of the invention showing the take-up side drive system thereof.

FIG. 9 is a top view of the system of the alternative embodiment of the invention showing the take-up side drive system 40".

As illustrated in FIGS. 6 and 7, each of the sprocket wheels 31–38 and 41–48 has an associated pinch roller 61–68 and 71–78, respectively. In FIG. 7, note that a motor 69 is provided to drive a gear 79 via a belt 70.

The top views of FIGS. 8 and 9 illustrate the dual track implementation of the embodiment. The track assemblies are identical with the exception that the reference numerals of the first track carry an 'a' designation and those of the second track carry a 'b' designation. Accordingly, the disclosure below will focus on a single track with the expectation that the reader will understand that the description applies equally to the second track.

In FIG. 8, each sprocket 31a–38a is connected via a corresponding shaft 91a–98a to a corresponding slip clutch 81a–88a. Slip clutches are well known in the art and include a series of magnets that provide rotational resistance based on user selection. On the supply side 30", the slip clutches 81–88 are passive slip clutches to supply a predetermined tension.

In FIG. 9, each sprocket wheel 41a–47a is connected to an associated slip clutch 101a–107a via a corresponding shaft 111a–117a. The index wheel 48a is not connected to a slip clutch. With the exception of the index wheel 48a, each sprocket wheel 41a–47a is driven by the motor 69 via a gear 79a. Hence, the take-up side slip clutches are active. Slip clutches may be purchased from Magpower Inc.

The inventive system utilizes pinch rollers and stripper guides of suitable radius to maintain high tension on the tape as it moves through a plurality of bake ovens. High tension is distributed over a longer area of the tape than with prior systems and is maintained without exposing the flex circuit to a stressful bend angle under high tension. In addition, each sprocket hole experiences minimal force due to the force/tension distribution methodology of the present invention.

Figure 10:
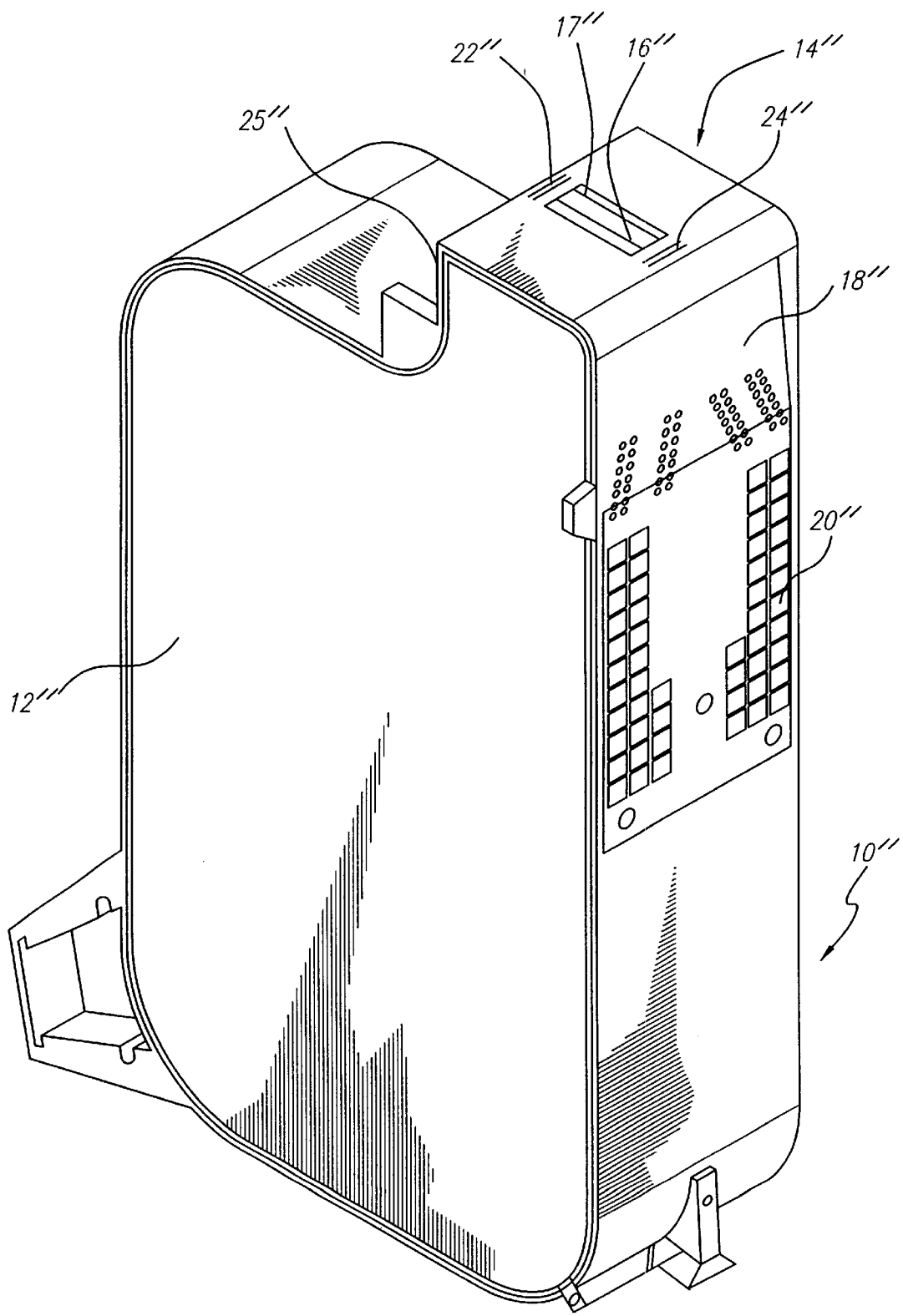
FIG. 10 is a perspective view of an inkjet print cartridge according to one embodiment of the present invention.

FIG. 10 is a perspective view of an inkjet print cartridge according to one embodiment of the present invention. Referring to FIG. 10, reference numeral 10" generally indicates an inkjet print cartridge incorporating a printhead according to one embodiment of the present invention simplified for illustrative purposes. The inkjet print cartridge 10" includes an ink reservoir 12" and a printhead 14", where the printhead 14" is formed using Tape Automated Bonding (TAB). The printhead 14" (hereinafter "TAB head assembly 14") includes a nozzle member 16" comprising two parallel columns of offset holes or orifices 17" formed in a flexible polymer flexible circuit 18" by, for example, laser ablation.

A black surface of the flexible circuit 18" includes conductive traces 36" formed thereon using a conventional photolithographic etching and/or plating process. These conductive traces 36" are terminated by large contact pads 20" designed to interconnect with a printer. The print cartridge 10" is designed to be installed in a printer so that the contact pads 20", on the front surface of the flexible circuit 18", contact printer electrodes providing externally generated energization signals to the printhead.

Windows 22" and 24" extend through the flexible circuit 18" and are used to facilitate bonding of the other ends of the conductive traces 36" to electrodes on a silicon substrate containing heater resistors. The windows 22" and 24" are filled with an encapsulant to protect any underlying portion of the traces and substrate.

In the print cartridge 10" of FIG. 10, the flexible circuit 18" is bent over the back edge of the print cartridge "snout" and extends approximately one half the length of the back wall 25" of the snout. This flap portion of the flexible circuit 18" is needed for the routing of conductive traces 36" which are connected to the substrate electrodes through the far end window 22". The contact pads 20" are located on the flexible circuit 18" which is secured to this wall and the conductive traces 36" are routed over the bend and are connected to the substrate electrodes through the windows 22" and 24" in the flexible circuit 18".

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A system for fabrication of flexible circuits consisting of a flexible tape, said system comprising:

an oven and

N independent tensioners, where N is greater than 2, for moving a strip of said tape through said oven by applying a cumulative tension force T on said tape, each tensioner applying T/N of the total tension in a single plane of the tape parallel to a longitudinal axis thereof.

2. The invention of claim 1 wherein the tension is applied tangentially by said tensioners.

3. The invention of claim 2 wherein the tensioners move said tape along a velocity vector parallel to the longitudinal axis of the tape.

4. The invention of claim 2 wherein the independent tensioners are sprocket wheels.

5. The invention of claim 4 wherein the sprocket wheels are adapted to engage sprocket holes in said tape.

6. The invention of claim 4 wherein the independent tensioners include N sprocket wheels on a supply side of said system.

7. The invention of claim 6 wherein said independent tensioners include N sprocket wheels on a take-up side of said system.

8. The invention of claim 7 wherein at least one sprocket wheels on the take-up side of the system is driven by a motor.

9. The invention of claim 7 including an index wheel on the take-up side of the system for providing precise positional indexing and/or velocity control of said tape.

10. The invention of claim 7 including a slip clutch connected to each sprocket wheel.

11. The invention of claim 1 including a supply reel for feeding tape to said tensioners.

12. The invention of claim 1 including a take-up reel for receiving tape from said tensioners.

13. The invention of claim 1 wherein said tape is made of polyimid.

14. The invention of claim 13 wherein said tape is Kapton.

15. The invention of claim 1 wherein said tape has copper conductors thereon.

16. The invention of claim 15 including a silicon die bonded to said tape.

17. A system for fabrication of flexible circuits consisting of a flexible tape, said system comprising:

an oven and a plurality of sprocket wheels on a supply side of said oven and a plurality of sprocket wheels on a take-up side of said oven, said sprocket wheels being adapted to apply a tension force on said tape in a single plane of the tape parallel to a longitudinal axis thereof.

18. The invention of claim 17 wherein the wheels move a strip of said tape through said oven by tangentially applying a cumulative tension force T on said tape in said single plane of the tape parallel to a longitudinal axis thereof, each wheel applying T/N of the total tension, where N is the total number of wheels per side.

19. The invention of claim 17 wherein the wheels move said tape along a velocity vector parallel to the longitudinal axis of the tape.

20. The invention of claim 17 wherein the sprocket wheels are adapted to engage sprocket holes in said tape.

21. The invention of claim 17 including eight sprocket wheels on the supply side of said oven.

22. The invention of claim 21 including eight sprocket wheels on the take-up side of said oven.

23. The invention of claim 17 including a supply reel for feeding tape to said wheels.

24. The invention of claim 17 including a take-up reel for receiving tape from said wheels.

25. A method for fabricating flexible circuits comprising:

heating an oven to a predetermined temperature and moving a strip of tape through said oven by applying a cumulative tension force T on said tape using N independent tensioners, where N is greater than 2, each tensioner applying T/N of the total tension.

26. The invention of claim 25 including the step of applying the tension tangentially.

27. The invention of claim 26 including the step of applying the tension tangentially in a single plane of the tape parallel to a longitudinal axis thereof.

28. The invention of claim 25 including the step of moving said tape along a direction parallel to the longitudinal axis of the tape.

29. The invention of claim 25 including the step applying the tension using sprocket wheels.

* * * * *